(12) United States Patent
Tate

(10) Patent No.: US 9,301,422 B1
(45) Date of Patent: Mar. 29, 2016

(54) HEAT SINK WITH INTERNAL FAN

(71) Applicant: John O. Tate, Lincoln, RI (US)

(72) Inventor: John O. Tate, Lincoln, RI (US)

( * ) Notice: Subject to any disclaimer, the term of this patent is extended or adjusted under 35 U.S.C. 154(b) by 0 days.

(21) Appl. No.: 14/675,937

(22) Filed: Apr. 1, 2015

(51) Int. Cl.
*H05K 7/20* (2006.01)
*F28F 13/06* (2006.01)

(52) U.S. Cl.
CPC ............ *H05K 7/20145* (2013.01); *F28F 13/06* (2013.01); *H05K 7/20172* (2013.01)

(58) Field of Classification Search
CPC .......... H05K 7/20136; H05K 7/20154; H05K 7/20909
USPC .................. 361/694–697, 709, 710
See application file for complete search history.

(56) References Cited

U.S. PATENT DOCUMENTS

| | | | | |
|---|---|---|---|---|
| 3,592,260 | A * | 7/1971 | Berger | 165/121 |
| 5,419,780 | A * | 5/1995 | Suski | 136/205 |
| 5,592,363 | A * | 1/1997 | Atarashi et al. | 361/689 |
| 5,787,971 | A * | 8/1998 | Dodson | 165/121 |
| 6,373,700 | B1 * | 4/2002 | Wang | 361/698 |
| 6,421,239 | B1 * | 7/2002 | Huang | 361/696 |
| 6,530,231 | B1 * | 3/2003 | Nagy et al. | 62/3.2 |
| 6,779,348 | B2 * | 8/2004 | Taban | 62/3.2 |
| 6,798,663 | B1 * | 9/2004 | Rubenstein | 361/710 |
| 6,894,898 | B2 * | 5/2005 | Liu | 361/697 |
| 6,950,306 | B2 * | 9/2005 | Huang et al. | 361/697 |
| 6,980,434 | B2 * | 12/2005 | Ou Yang et al. | 361/695 |
| 7,128,140 | B2 * | 10/2006 | Barmoav et al. | 165/185 |
| 7,198,094 | B2 * | 4/2007 | Barsun et al. | 165/80.3 |
| 7,405,933 | B2 * | 7/2008 | Kobayashi et al. | 361/695 |
| 7,447,020 | B2 * | 11/2008 | Xia et al. | 361/695 |
| 7,952,872 | B1 * | 5/2011 | Hata et al. | 361/697 |
| 8,011,423 | B2 * | 9/2011 | Uchimura et al. | 165/122 |
| 8,640,466 | B2 * | 2/2014 | Bell et al. | 62/3.7 |
| 8,721,359 | B1 * | 5/2014 | Tate | 439/487 |
| 2003/0140636 | A1 * | 7/2003 | Van Winkle | 62/3.61 |
| 2005/0047086 | A1 | 3/2005 | Gedamu | |
| 2006/0219388 | A1 * | 10/2006 | Terakado et al. | 165/80.4 |
| 2007/0012423 | A1 * | 1/2007 | Kinoshita et al. | 165/80.4 |
| 2009/0229794 | A1 * | 9/2009 | Schon | 165/104.21 |
| 2010/0132923 | A1 * | 6/2010 | Batty et al. | 165/104.26 |

FOREIGN PATENT DOCUMENTS

EP 1742263 A2 10/2007

* cited by examiner

*Primary Examiner* — Anatoly Vortman
(74) *Attorney, Agent, or Firm* — Barlow, Josephs & Holmes, Ltd.

(57) ABSTRACT

A heat sink includes a base and a cover that can be assembled to form a heat sink body, with a channel defined between the base and the cover. The channel extends from a first opening to a second opening. A fan secured to the heat sink body is configured to move air through the first opening, through the channel, and then out through the second opening. Electrical terminals are supported on an insulating body secured to the base. Each electrical terminal has an upper end for receiving a lead of an electronic device, and a lower end for engaging another socket or a printed circuit board. Vias extending through the cover are aligned with the electrical terminals so that a lead of an electronic device can extend through a via into the socket of an electrical terminal. Fins extend from the cover and/or the base.

7 Claims, 13 Drawing Sheets

HEAT SINK WITH INTERNAL FAN

BACKGROUND OF THE DISCLOSURE

The instant invention relates to a heat sink for an electronic device, and more particularly to an internally cooled heat sink that provides an electronic device socket for electronic devices. The heat sink is configured to sit beneath the device.

Increased heat in electronic devices tends to increase noise in electrical signals.

SUMMARY OF THE INVENTION

A heat sink having an internal fan includes a base and a cover that can be assembled together to form a heat sink body. The base has an upper surface and a lower surface, and the cover has an upper surface and a lower surface. When the base and the cover are assembled to form the heat sink body, the upper surface of the base and the lower surface of the cover are in adjacent facing relation and are in thermally conductive relation.

A canal wall can be defined on the lower surface of the cover or on the upper surface of the base, or on both the lower surface of the cover and the upper surface of the base. The canal wall at least partially defines a channel running through the heat sink body. That is, if a canal wall is defined in only the base, then the canal wall and the lower surface of the cover define the channel. In other embodiments, the canal wall can include a first canal wall portion defined on the cover and a second canal wall portion defined on the base, so the first and second canal wall portions together define the channel within the heat sink body when the base and the cover are assembled to form the heat sink body.

When the base and cover are assembled to form the heat sink body, the channel extends from a first channel opening defined on the heat sink body to a second channel opening defined on the heat sink body.

A fan moves air through the channel, so that air is drawn into the channel through the first channel opening, moved through the channel towards the second channel opening, and pushed out of the channel through the second channel opening. A fan brace rotationally fixes the motor with respect to the heat sink body.

The first channel opening and the second channel opening can be defined on the same side wall of the heat sink body.

The heat sink assembly provides electrical terminals that are useful for connecting a printed circuit board (PCB) positioned below the heat sink body to an electronic device seated on the upper surface of the heat sink body. In the exemplary embodiment, electrical terminals are secured to an insulating body that is secured to the base. Each electrical terminal has an upper terminal end with a socket for receiving a lead of an electronic device, and a lower terminal end with a pin that extends below the lower surface of the base. The socket and the pin are electrically connected. To allow the leads of the electronic device to be received in the sockets of the electrical terminals on the base, vias extend through the cover. Each via extends from the upper surface of the cover to the lower surface of the cover. Each via is positioned on the cover to be aligned with the electrical terminals of the base so leads of the electronic device can extend through the vias and into the sockets of the electrical terminals when the cover and the base are assembled to form the heat sink body.

In the exemplary embodiments, the fan includes a rotor, fan blades secured to the rotor, and a motor that is operable to rotate the rotor with respect to the heat sink body. The fan motor can be rotationally secured within the heat sink body by a fan brace that engages a fan support wall within the heat sink body. In the exemplary embodiment, the brace engages the fan support wall and the lower surface of the cover. The fan can include lead wires for connecting the fan motor to an external power source, which is provided separately from the heat sink of the present invention.

In some embodiments, fins extend from the heat sink body, and the fins dissipate heat from an electronic device seated on the heat sink body. The fins can be dimensioned and configured so that they extend outwardly from at least one of the side walls of the heat sink body.

The base and the cover can be secured together, for example by solder, cement, or fasteners.

Accordingly, among the objects of the instant invention are: the provision of a heat sink body that includes a channel defined within the heat sink body; the provision of a heat sink body with a fan that pushes air through a channel defined within the heat sink body; and the provision of a heat sink body that relies on airflow through a channel within the heat sink body to provide low cost operation of the heat sink body to cool an electronic device seated on the heat sink body.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated of carrying out the present invention.

DESCRIPTION OF THE PREFERRED EMBODIMENT

Figure 1:
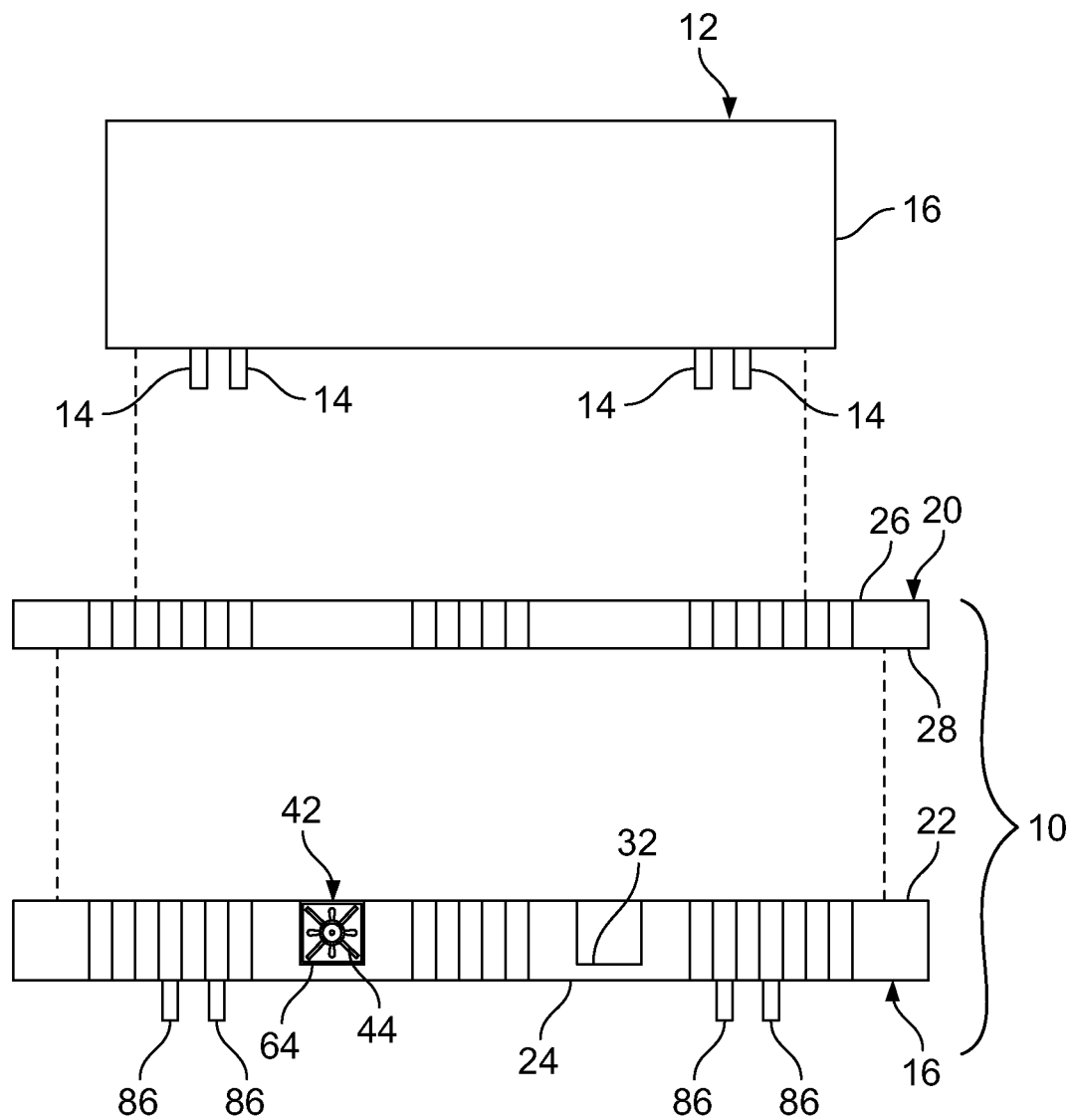
FIG. 1 is a partially exploded front view of a first exemplary embodiment of the heat sink assembly of the present invention shown with an electrical device.
Figure 2:
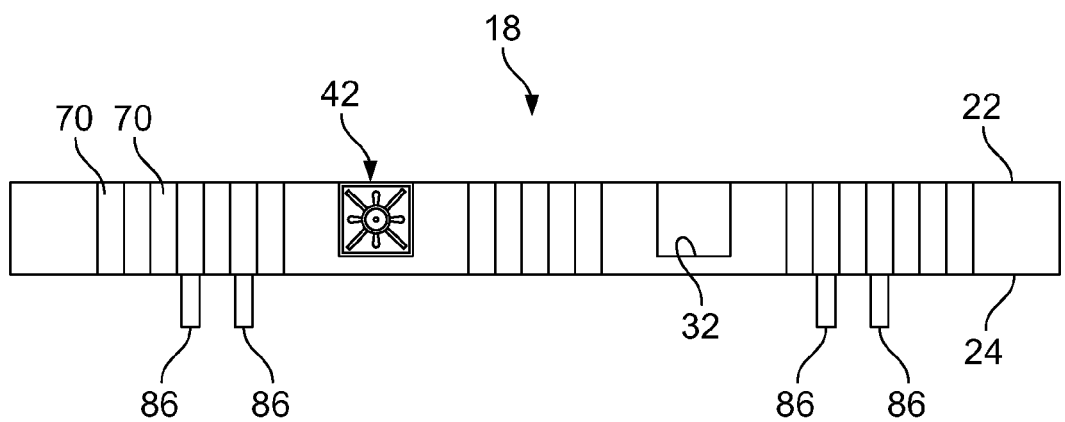
FIG. 2 is a front view of the base of the first embodiment of the heat sink.
Figure 3:
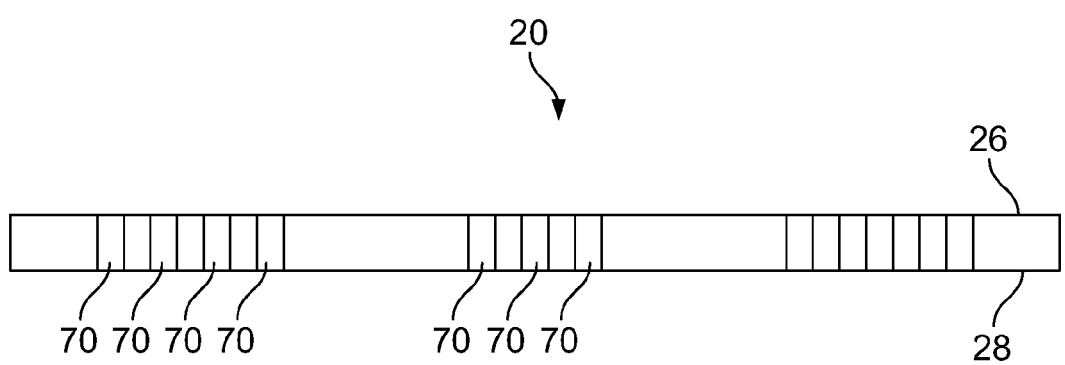
FIG. 3 is a front view of the cover of the first embodiment of the heat sink.

Referring now to the drawings, a first exemplary embodiment of a heat sink with internal fan of the instant invention is illustrated and generally indicated at 10 in FIGS. 1-9. As will hereinafter be more fully described, the instant heat sink with internal fan (or heat sink assembly) 10 is intended to be used with an electronic device generally indicated at 12 having a plurality of leads 14 extending from the electronic device body 16. The device 12, as illustrated, comprises two 2×18 arrays of pins (or leads) 14. However, the scope of the invention is not to be limited by the specific device shown or limited to any particular configuration of leads, or shape, i.e. square, rectangular, or round with leads protruding therefrom.

The instant heat sink assembly 10 includes a base 18 and a cover 20 that can be provided as separate components, or that can be provided in a hinged clamshell configuration. In the exemplary embodiments, the base 18 and the cover 20 are separate components. FIG. 1 shows an exploded view of a first embodiment. The heat sink body 11 comprises the cover 20 and the base 18, and is assembled by placing the cover 20 onto the base 18. A device 12, which can be provided separately from the heat assembly of the present invention, can be placed on the upper surface 26 of the cover 20.

Figure 6:
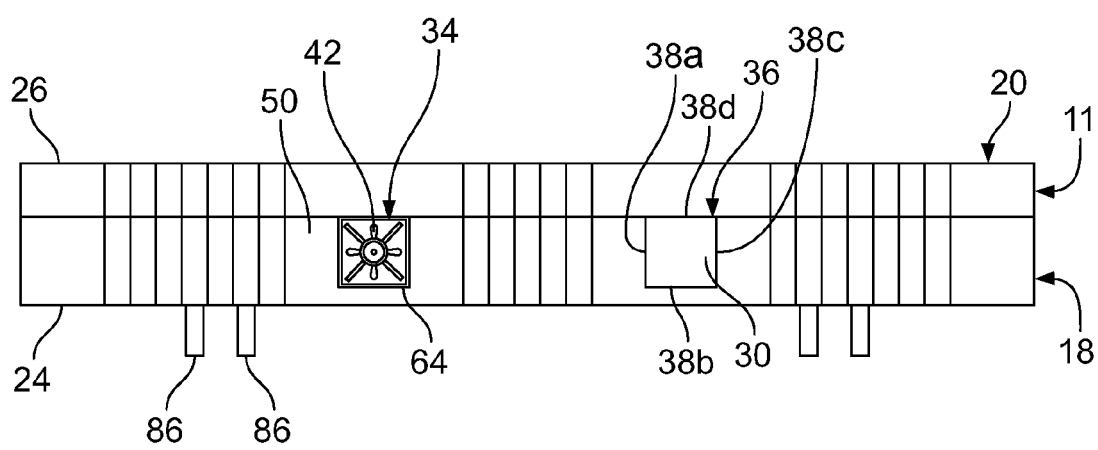
FIG. 6 is a front view of the first embodiment.

Turning to the heat sink body 11, the base 18 has an upper surface 22 and a lower surface 24. The cover 20 has an upper surface 26 and a lower surface 28. The base 18 and the cover 20 are configured to be assembled so that the upper surface of the base 22 and the lower surface of the cover 28 are in adjacent facing relation and in thermally conductive relation. The base 18 and the cover 20 thereby form a heat sink body 11. FIG. 6 shows an assembled heat sink body 11. The fan secured within the heat sink body is discussed in more detail below.

The base 18 and the cover 20 are dimensioned and configured to define a channel 30 within the heat sink body 11 when the cover 20 and the base 18 are assembled to form the heat sink body 11. In the first embodiment, the lower surface of the cover 28 is substantially flat, and the upper surface of the base 22 is substantially flat except for a canal wall 32 defined on the base. This canal wall 32 is visible in FIGS. 2, 4, and 7. The canal wall 32 can be formed by machining material away from the upper surface of the base 22, or it can be formed by another method such as casting or molding. Thus, in the first exemplary embodiment, when the cover 20 is placed over the base 18 and secured to the base, the lower surface of the cover 28 and the canal wall 32 together define a channel 30 extending through the heat sink body 11, as shown in FIG. 6.

The channel 30 extends from a first channel opening 34 defined on the heat sink body to a second channel opening 36 defined on the heat sink body. In the first embodiment, the second channel opening is formed substantially as a square opening, with three sides 38A, 38B, 38C of the second channel opening 36 extending along an edge of the canal wall 32 defined on the base 18, and with the fourth side 38D of the second channel opening 36 extending along an edge on the lower surface of the cover 28, as shown in FIG. 6. Similarly, in the first embodiment, the first channel opening 34 is formed substantially as a square opening, with three sides of the first channel opening extending along an edge of the fan support wall 64 that is recessed from the canal wall 32 defined on the base 18, and with the fourth side of the first channel opening extending along an edge of the cover 20.

FIG. 6 shows the cover 20 secured to the base 18, with the upper surface of the cover defining the upper surface of the heat sink body, and the lower surface of the base defining the lower surface of the heat sink body. The heat sink body 11 includes side walls that extend between the upper surface of the heat sink body and the lower surface of the heat sink body, including a front wall, a rear wall, a left wall, and a right wall. The front wall of the heat sink body includes the front wall of the base and the front wall of the cover. The rear wall of the heat sink body includes the rear wall of the base and the rear wall of the cover. The left and right walls of the heat sink body respectively include the left and right walls of the base and the cover.

FIGS. 1 and 6 show the first channel opening and the second channel opening and the second channel opening defined on the same side of the heat sink body. In FIG. 6, the channel 30 is shown with a first channel opening 34 on a front side wall 50 of the heat sink body 11, and a second channel opening 36 on the front side wall 50 of the heat sink body 11. By having the first and second channel openings on the same side wall of the heat sink body, air is allowed to flow through a channel that extends in a U-shape through the heat sink body, so the channel extends adjacent to the arrays of electrical terminals 80, which are seated in the base 18 and which are discussed in more detail below. It should be noted that the channel 30 can take on many different shapes and paths through the heat sink base 18 and that the scope of disclosure should not be limited to only a U-shape. The shape of the channel 30 will vary depending on the location of the most amount of heat being removed from the device 12. In this regard, the channel 30 can be like an "M" shape, spiral, serpentine, etc. to concentrate the most surface area and airflow in the vicinity of the most heat.

Although the first embodiment shows the canal wall 32 defined on the upper surface of the base 22, as in FIG. 1, the canal wall can be defined on the lower surface of the cover, the upper surface of the base, or it can be defined as canal wall portions on both the lower surface of the cover and the upper surface of the base.

Figure 11:
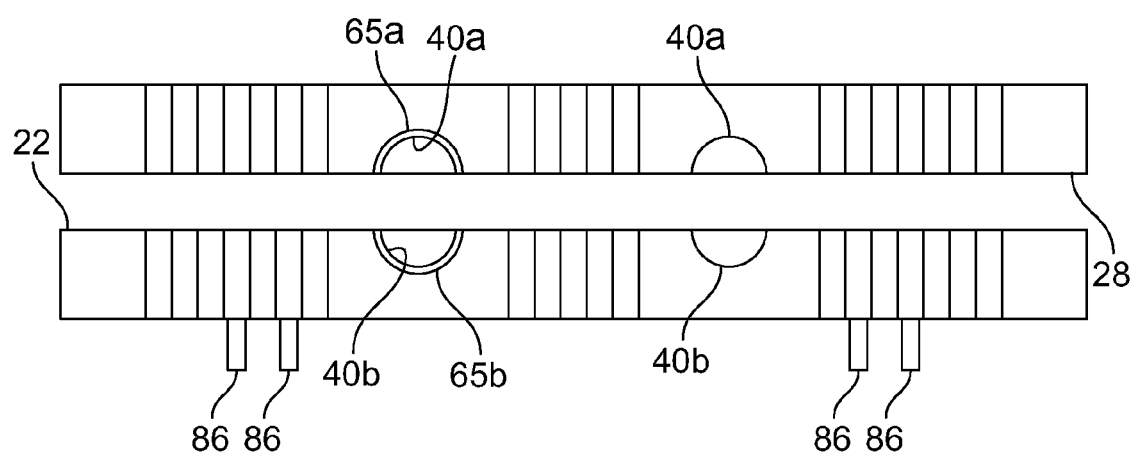
FIG. 11 is a partially exploded front view of the second embodiment of the heat sink without the fan installed.
Figure 12:
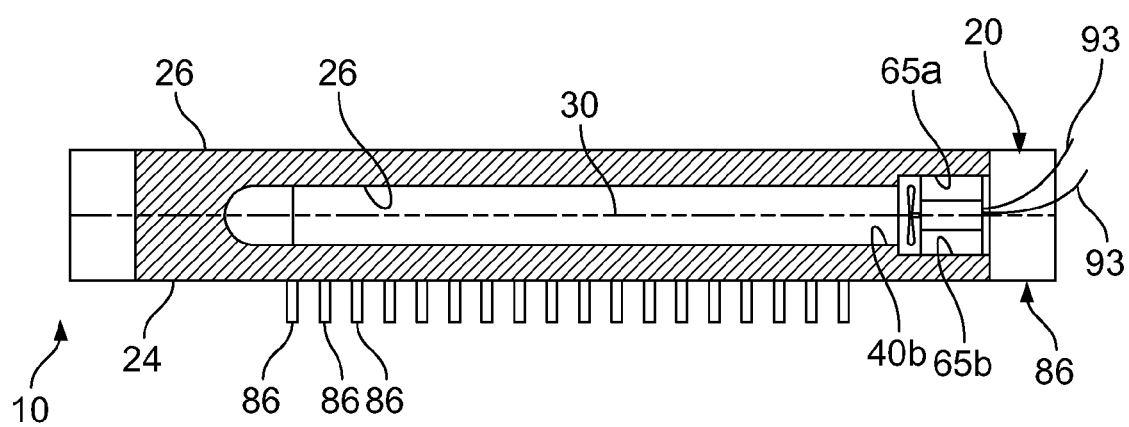
FIG. 12 is a cross-sectional view taken along line 12-12 of FIG. 10.
Figure 13:
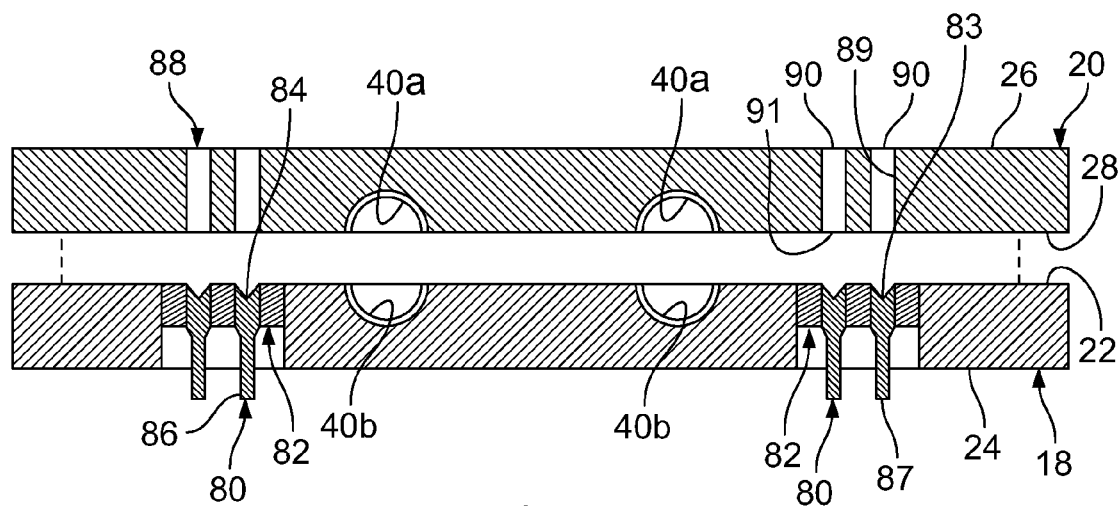
FIG. 13 is another partially exploded cross-sectional view taken along line 13-13 of FIG. 10.
Figure 14:
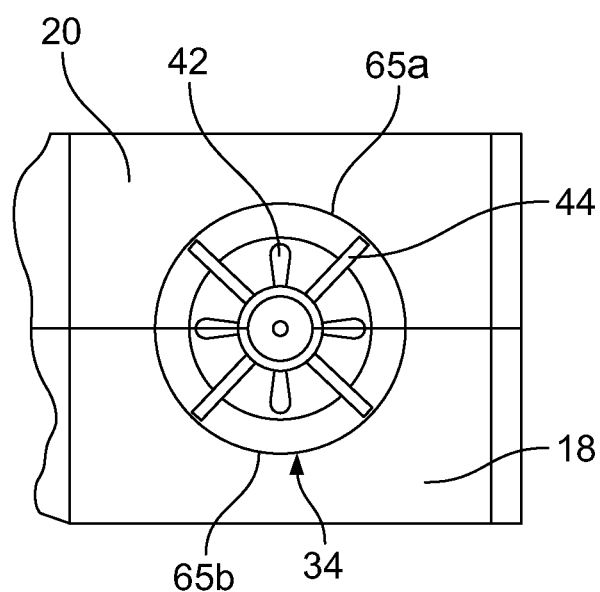
FIG. 14 is a partial front view of the second embodiment with the fan installed.

FIGS. 10-14 show a second embodiment having first and second channel openings that are at least substantially circular when viewed from the front. The canal wall in FIG. 11 includes a first canal wall portion 40A defined on the lower surface of the cover 28 and a second canal wall portion 40B defined on the upper surface of the base 22. FIGS. 11 and 13 show the first canal wall portion 40A formed as a downwardly concave semicircular wall defined on the lower surface of the cover 28, and the second canal wall portion 40B formed as an upwardly concave semicircular wall defined on the upper surface of the base 22. Together, the first canal wall portion 40A and the second canal wall portion 40B define a channel 30 extending through the heat sink body, in which the channel has a substantially circular cross-section. In FIG. 14, a first fan support wall portion 65A and a second fan support wall portion 65B are respectively recessed from the first canal wall portion 40A and second canal wall portion 40B, so that the first channel opening 34 is circular and is defined by the first and second fan support wall portions 65A, 65B. A fan 42 is seated in the fan recess defined by the first and second fan support wall portions 65A, 65B. Similarly, the second channel opening 36 is circular in the second embodiment, and is defined by the first canal wall portion 40A and the second canal wall portion 40B.

Similar to the different shapes of the channel openings 34, 36 discussed above, the channel 30 itself may have a square or circular cross-sectional profile when viewed along its length. Other shapes are also possible.

Figure 4:
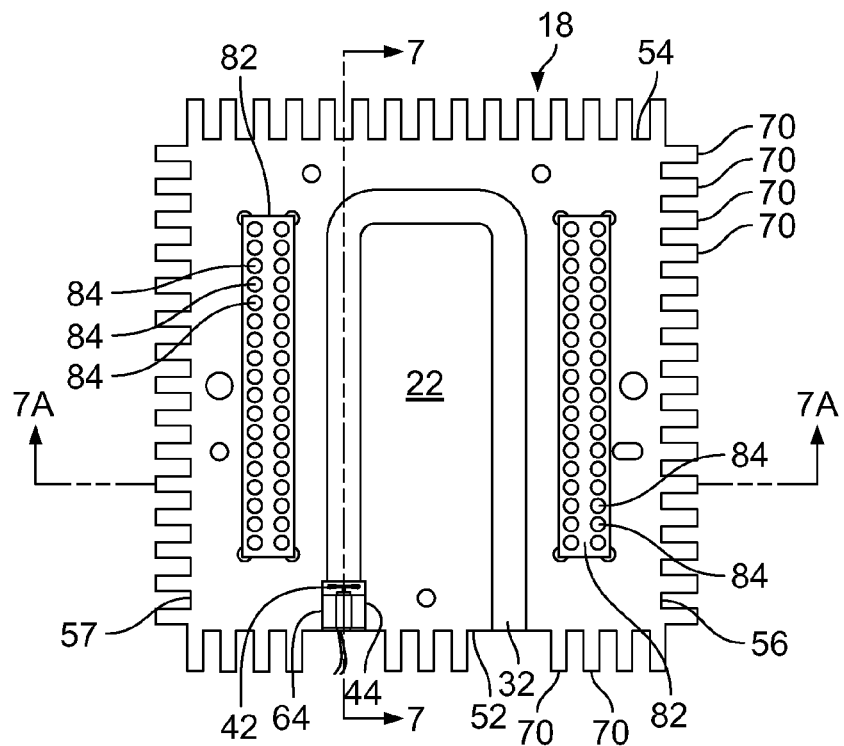
FIG. 4 is a top view of the base of the first embodiment of the heat sink.

FIG. 4 shows how the canal wall 32 of the first embodiment extends along the base to define the channel 30. The channel 30 extends from the first channel opening along the front edge 52 of the base 18 towards the rear edge 54 of the base 18, then extends towards the right edge 56 of the base 18, and then extends towards the second channel opening on the front edge 52 of the base 18. When the base 18 and the cover 20 of FIGS. 2-5 are assembled to form a heat sink body 11, the channel 30 guides air from outside the heat sink body into the heat sink body through the first channel opening 34 on the front face 50 of the heat sink body 11, towards the rear face of the heat sink body, then towards the right side of the heat sink body, and then to the second channel opening 36 on the front face 50 of the heat sink body 11, where the air exits the heat sink body 11.

Figure 5:
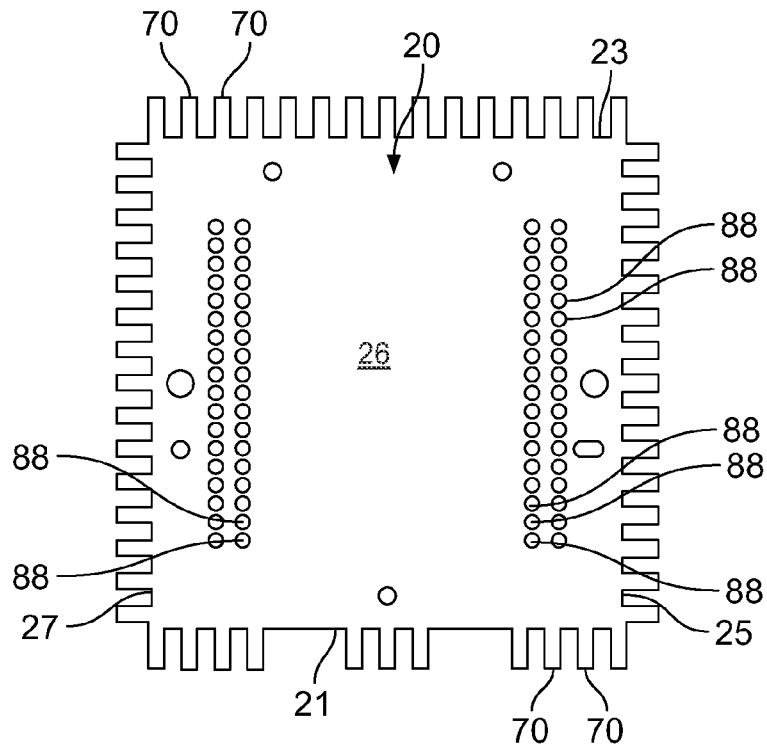
FIG. 5 is a top view of the cover of the first embodiment of the heat sink.

FIG. 5 shows a top view of the cover 20 of the first embodiment, with the front edge 21 of the cover, the rear edge 23 of the cover, the right edge 25 of the cover and the left edge 27 of the cover.

Figure 7:
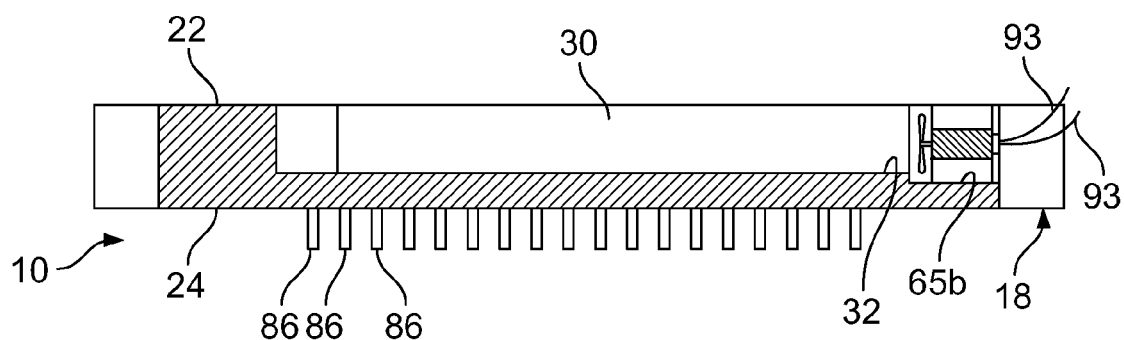
FIG. 7 is a cross-sectional view taken along line 7-7 of FIG. 4.

FIG. 7 provides a cross-sectional view of the base of the first embodiment, showing the canal wall 32 as it extends from the front of the base towards the rear of the base. Similarly, FIG. 12 provides a cross-sectional view of the heat sink body of the second embodiment, showing the first and second canal wall portions 40A, 40B extending within the heat sink body of the second embodiment to define the channel 30.

Returning to FIG. 4, a fan 42 forces air through the channel so that there is sufficient forced air cooling of the channel 30 within the heat sink body 11. The fan 42 draws air into the channel through the first channel opening 34, advances air through the channel towards the second channel opening 36, and pushes air out of the channel 30 through the second channel opening 36. FIG. 4 shows the location of arrays of electrical terminals 80 having sockets 84, discussed below.

Figure 8:
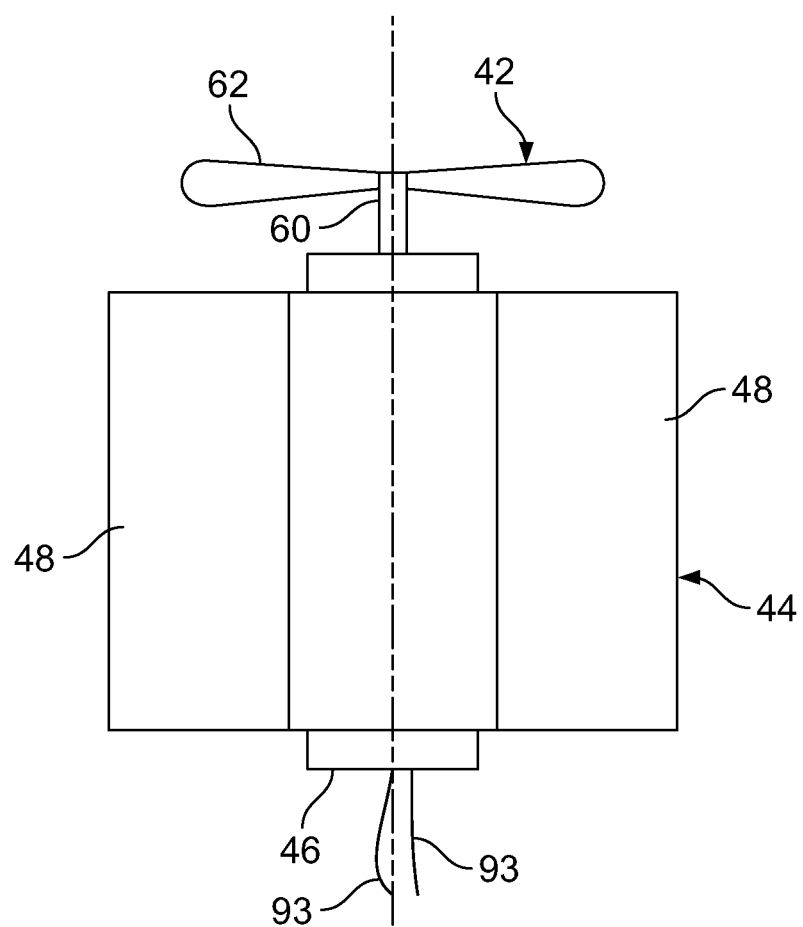
FIG. 8 is a top view of a fan and fan brace.
Figure 9:
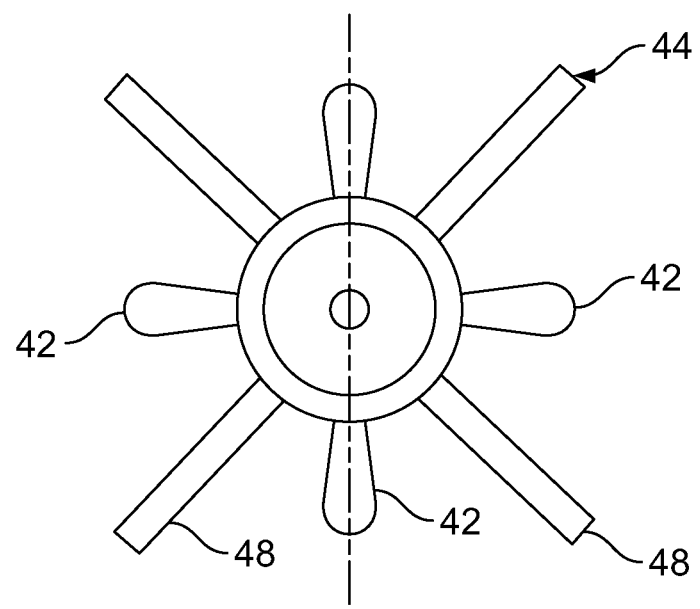
FIG. 9 is a front view thereof.
Figure 10:
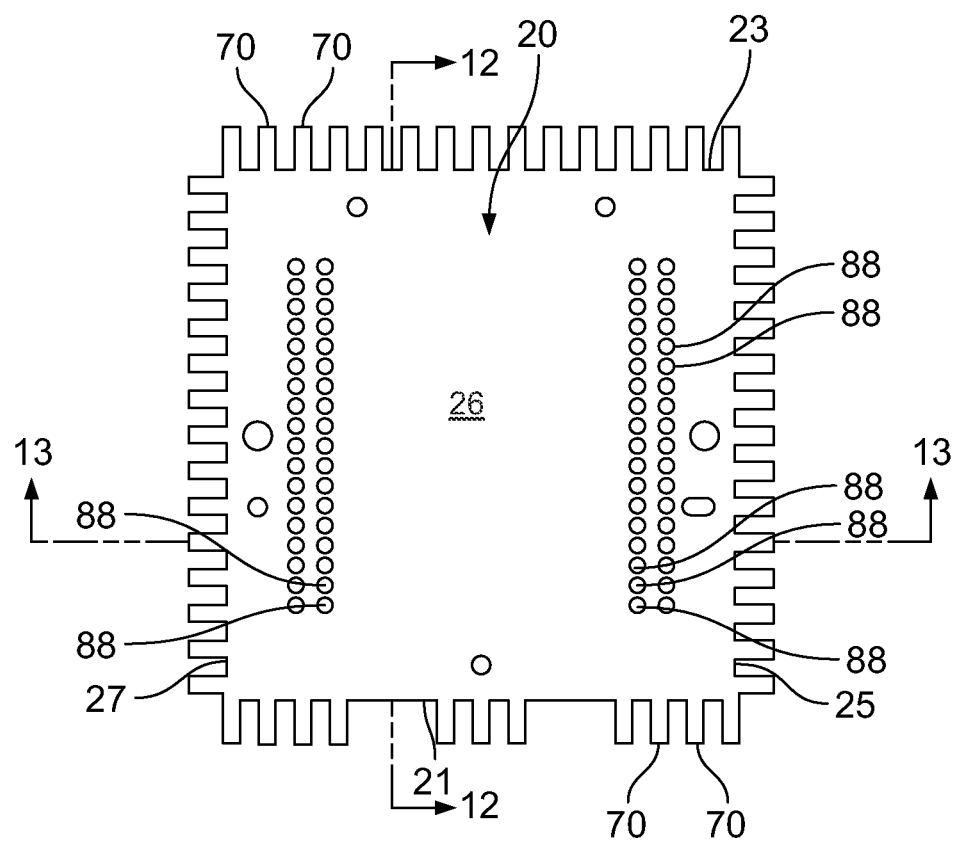
FIG. 10 is a top view of a second embodiment.

FIGS. 4, 8, and 9 show how a fan 42 can be seated in the heat sink body 11 of the first embodiment. In the second embodiment, the fan brace 44 of FIG. 14 is secured to the motor 46 of the fan 42, and the fan brace 44 has brace walls 48 that extend outwardly from the motor 46 to frictionally engage (or otherwise securely engage) the respective first and second support wall portions 65A, 65B, and thereby rotationally fix the motor 46 of the fan 42 with respect to the heat sink body 11.

The fan 42 includes a rotor 60, fan blades 62 secured to the rotor 60, and a motor 46 connected to the rotor 60. A fan brace is secured to the motor, and the fan brace is configured to rotationally fix the motor with respect to the heat sink body. FIGS. 8 and 9 show an embodiment of the fan brace 44 having four brace arms 48 extending away from the motor 46. Thus, in FIGS. 1 and 9, the brace arms 48 extend radially outwardly from the axis of the motor 46 towards the adjacent contact surfaces on the base and the cover in the respective first and second embodiments of the heat sink body.

In the first embodiment, the fan 42 can be received in a fan recess defined by a fan support wall 64. The fan support wall 64 is recessed from the canal wall 32, for example as shown in FIG. 1, so that the fan support wall 64 and canal wall 32 define a stepped channel 30 that is wider in the region of the channel defined by the fan support wall 64 and narrower in the region of the channel defined by the canal wall 32. Thus, in the embodiment of FIG. 1, the fan brace 44 is configured to rotationally fix the motor 46 with respect to the heat sink body 11 by engaging the fan support wall 64 and the lower surface 28 of the cover.

In other embodiments, the brace arms 48 can engage different surfaces defined on the cover and the base. For example, FIGS. 10-14 show an embodiment in which first and second canal wall portions 40A, 40B are defined on the base 18 and the cover 20. In the embodiment of FIGS. 10-14, the brace arms 48 engage the first support wall portion 65A and the second support wall portion 65B. Still other configurations of the fan brace are possible. Generally, the fan brace includes at least one brace arm that rotationally fixes or substantially rotationally fixes the fan motor with respect to the heat sink body.

To improve the ability of the heat sink to dissipate heat from an electronic device to the surroundings, the heat sink can be provided with fins 70 that extend from the cover 20 and/or the base 18. FIGS. 1-9 show an embodiment having fins 70 that extend from both the cover 20 and the base 18. The top view of the base 18 in FIG. 4 shows the base 18 having eleven fins 70 extending forwardly from the front edge 52 of the base 18, fifteen fins 70 extending rearwardly from the rear edge 54 of the base 18, fifteen fins 70 extending to the left from the left edge 57 of the base 18, and fifteen fins 70 extending to the right from the right edge 56 of the base 18. In other embodiments, more or fewer fins may be provided, and the shapes of the fins can be modified.

The heat sink body 11 supports electrical terminals 80 that allow a device seated on the heat sink body to be electrically connected to a printed circuit board (PCB) or another electronic device on which the heat sink body is seated (not shown). The heat sink assembly 10 includes at least one insulating body 82 secured to the base 18, with at least one electrical terminal 80 secured to the insulating body 82. Each electrical terminal 80 has an upper terminal end 83 and a lower terminal end 87. The upper terminal end 83 is formed as a socket 84 so it can receive a lead of an electronic device. The lower terminal end 87 has a pin 86 that extends below the lower surface 24 of the base 18. The socket 84 of the upper terminal end 83 and the pin 86 of the lower terminal end 87 are electrically connected.

In other embodiments that are not shown, the pin 86 of each lower terminal end 87 does not extend below the lower surface 24 of the base 18, but is configured to be connected to a socket of another electronic device or component that is positioned beneath the heat sink body.

Figure 7A:
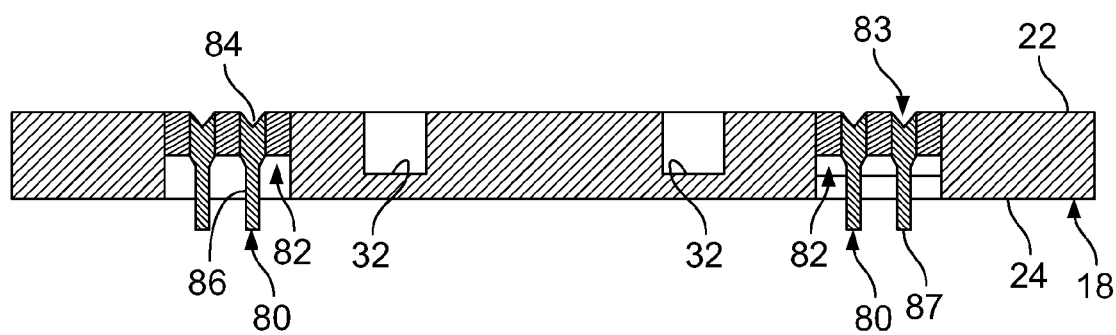
FIG. 7A is a cross-sectional view taken along the line 7A-7A of FIG. 4.

The sockets 84 of the electrical terminals 80 are accessible through vias 88 defined in the cover 20. The vias 88 are aligned with the electrical terminals 80, and are above the electrical terminals 80 of the heat sink body. In particular, in FIG. 5, each via is defined in the cover so that it is positioned over a respective socket. FIG. 7A shows a cross-sectional view of the base 18, with four vias 88 positioned over four respective electrical terminals 80. Each via 88 extends through the cover 20 from the upper surface of the cover to the lower surface of the cover.

Each via 88 is defined by an annular via wall 89 that extends from the upper via opening 90 on the upper surface 26 of the cover to a lower via opening 91 on the lower surface 28 of the cover. Each via 88 allows an electrical lead 14 of an electronic device 12 to extend through the respective via 88 and into the socket 84 of the respective electrical contact 80.

The base 18 and the cover 20 can be secured together. For example, the base 18 and the cover 20 can be secured together in assembled relation by solder, cement, or fasteners.

The fan 42 may be an electrically powered fan, and the fan may further include lead wires 93 connected to the motor 46. Each lead wire 93 has a first end connected to the motor and a second end that is free and can be connected to a power source (not shown). The lead wires 93 thus allow a power source to be electrically connected to the fan.

It can therefore be seen that the present invention provides a heat sink body that includes a channel defined within the heat sink body; provides a heat sink body with a fan that pushes air through a channel defined within the heat sink body; and provides a heat sink body that relies on airflow through a channel within the heat sink body to provide low cost operation of the heat sink body to cool an electronic device seated on the heat sink body. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A heat sink comprising:
   a lower base having an upper surface and a lower surface;
   an upper cover having an upper surface and a lower surface; the cover and the base being assembled so that the upper surface of the base and the lower surface of the cover are in adjacent facing relation, and the base and the cover thereby form a solid heat sink body, said upper surface of said cover receiving a heat producing device in heat conducting engagement;
   a canal wall defined on at least one of: the lower surface of the cover and the upper surface of the base, so that an air flow channel is defined at least partially by the canal wall when the cover and the base are in assembled relation; the air flow channel extending from a first channel opening defined on the heat sink body to a second channel opening defined on the heat sink body;
   a fan comprising a rotor, a plurality of fan blades secured to the rotor, and a motor connected to the rotor; and
   a fan brace rotationally fixing the fan within said air flow channel adjacent said first channel opening with said rotor being axially aligned with said air flow channel, said fan moving air through said channel so that air is drawn into the air flow channel from the first channel opening and is pushed out of said air flow channel through the second channel opening.

2. The heat sink of claim 1, further comprising a plurality of fins extending outwardly from peripheral side walls of the solid heat sink body.

3. The heat sink of claim 1, wherein:
   the first channel opening and the second channel opening are each defined on peripheral side walls of the solid heat sink body.

4. A heat sink comprising:
   a lower base having an upper surface and a lower surface;
   an upper cover having an upper surface and a lower surface; the cover and the base being assembled so that the upper surface of the base and the lower surface of the cover are in adjacent facing relation, and the base and the cover thereby form a heat sink body;
   a canal wall defined on at least one of: the lower surface of the cover and the upper surface of the base, so that a channel is defined at least partially by the canal wall when the cover and the base are in assembled relation; the channel extending from a first channel opening defined on the heat sink body to a second channel opening defined on the heat sink body;
   a fan comprising a rotor, a plurality of fan blades secured to the rotor, and a motor connected to the rotor;
   a fan brace rotationally fixing the motor with respect to the heat sink body, said fan moving air through the channel so that air is drawn into the channel through the first opening and is pushed out of the channel through the second opening;
   an insulating body secured to the base;
   a plurality of electrical terminals secured to the insulating body, each electrical terminal having an upper terminal end and a lower terminal end; the upper terminal end having a socket for receiving a lead of an electronic device; the lower terminal end having a pin that extends below the lower surface of the base; the socket and the pin being electrically connected;
   a plurality of vias extending through the cover from the upper surface of the cover to the lower surface of the cover; each via being positioned on the cover to be above one of the electrical terminals when the cover and the base are assembled to form the heat sink body;
   each via being defined by an annular via wall extending from an upper via opening on the upper surface of the cover to a lower via opening on the lower surface of the cover, each via allowing an electrical lead of the electronic device to extend through the respective via and into the socket of the respective electrical terminal.

5. The heat sink of claim 1, wherein the canal wall further comprises a first canal wall portion defined on the lower surface of the cover, and a second canal wall portion defined on the upper surface of the base;
   whereby the channel is defined by the first canal wall portion of the cover and the second canal wall portion of the base.

6. The heat sink of claim 1, wherein the base further comprises a fan support wall recessed from the canal wall, said fan brace rotationally fixing said motor relative to the fan support wall within the air flow channel.

7. A heat sink assembly comprising:
   a lower base portion having an upper surface and a lower surface;
   an upper cover portion having an upper surface and a lower surface; the cover portion and the base portion being assembled so that the upper surface of the base portion and the lower surface of the cover portion are in adjacent facing relation, the base portion and the cover portion thereby forming a solid heat sink body;
   an air flow channel extending through the solid heat sink body from a first channel opening defined on the heat sink body to a second channel opening defined on the heat sink body;
   a fan fixed within said air flow channel, said fan having a rotor axially in line with the air flow channel, said fan moving air longitudinally through the channel so that air is drawn into the channel through the first channel opening and is pushed out of the channel through the second channel opening;
   an insulating body secured to the base portion;
   a plurality of electrical terminals secured to the insulating body, each electrical terminal having an upper terminal end and a lower terminal end; the upper terminal end having a socket for receiving a lead of an electronic device; the lower terminal end having a pin that extends below the lower surface of the base portion; the socket and the pin being electrically connected;
   a plurality of vias extending through the cover portion from the upper surface of the cover portion to the lower surface of the cover; each via being positioned on the cover portion to be above one of the electrical terminals when the cover portion and base portion are assembled to form the heat sink body;
   each via allowing an electrical lead of the electronic device to extend through the respective via and into the socket of the respective electrical terminal.

* * * * *